United States Patent [19]
Ker et al.

[11] Patent Number: 6,144,542
[45] Date of Patent: Nov. 7, 2000

[54] ESD BUS LINES IN CMOS IC'S FOR WHOLE-CHIP ESD PROTECTION

[75] Inventors: Ming-Dou Ker, Hsinchu; Hun-Hsien Chang, Taipei, both of Taiwan

[73] Assignee: Taiwan Semiconductor Manufacturing Co., Ltd., Hsinchu, Taiwan

[21] Appl. No.: 09/210,954

[22] Filed: Dec. 15, 1998

[51] Int. Cl.⁷ ................................................. H02H 3/22
[52] U.S. Cl. .............................................. 361/111; 361/56
[58] Field of Search .............................. 361/111, 56, 54, 361/88, 91.1, 91.5; 257/355, 379; 327/306, 309, 310

[56] References Cited

U.S. PATENT DOCUMENTS

| | | | |
|---|---|---|---|
| 5,311,391 | 5/1994 | Dungan et al. | 361/56 |
| 5,530,612 | 6/1996 | Maloney | 361/56 |
| 5,561,577 | 10/1996 | Motley | 361/56 |
| 5,654,862 | 8/1997 | Worley et al. | 361/111 |
| 5,721,656 | 2/1998 | Wu et al. | 361/56 |
| 5,731,940 | 3/1998 | Minogue | 361/56 |
| 6,002,568 | 12/1999 | Ker et al. | 361/111 |
| 6,046,897 | 4/2000 | Smith et al. | 361/111 |
| 6,072,350 | 6/2000 | Fukuda | 327/313 |

*Primary Examiner*—Josie Ballato
*Assistant Examiner*—Kim Huynh
*Attorney, Agent, or Firm*—Nath & Associates; Harold L. Novick

[57] ABSTRACT

In this invention, a new whole-chip ESD protection scheme with the ESD buses has been proposed to solve the ESD protection issue of the CMOS IC having a large number of separated power lines. Multiple ESD buses, which are formed by the wide metal lines, have been added into the CMOS IC having a large number of separated power lines. The bi-directional ESD-connection cells are connected between the separated power lines and the ESD buses, but not between the separated power lines. The ESD current on the CMOS IC with more separated power lines are all conducted into the ESD buses, therefore the ESD current can be conducted by the ESD buses away from the internal circuits and quickly discharged through the designed ESD protection devices to ground. By using this new whole-chip ESD protection scheme with the ESD buses, the CMOS IC having more separated power lines can be still safely protected against ESD damages.

37 Claims, 16 Drawing Sheets

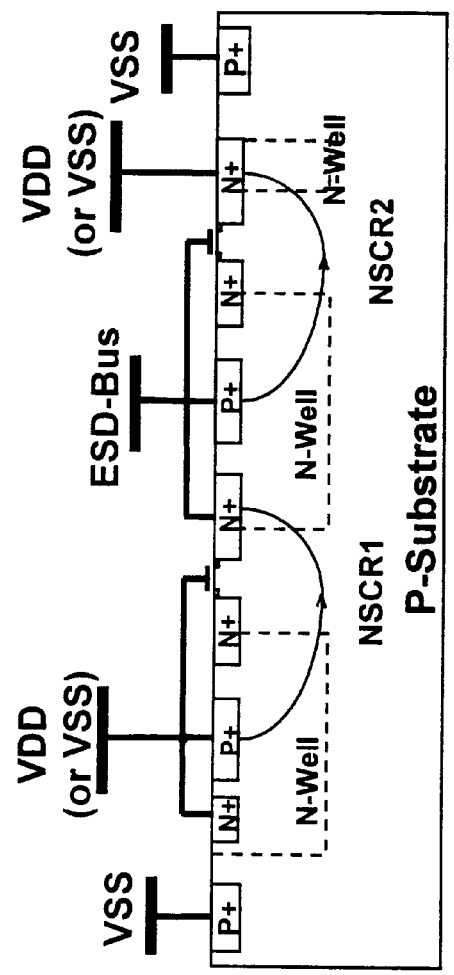
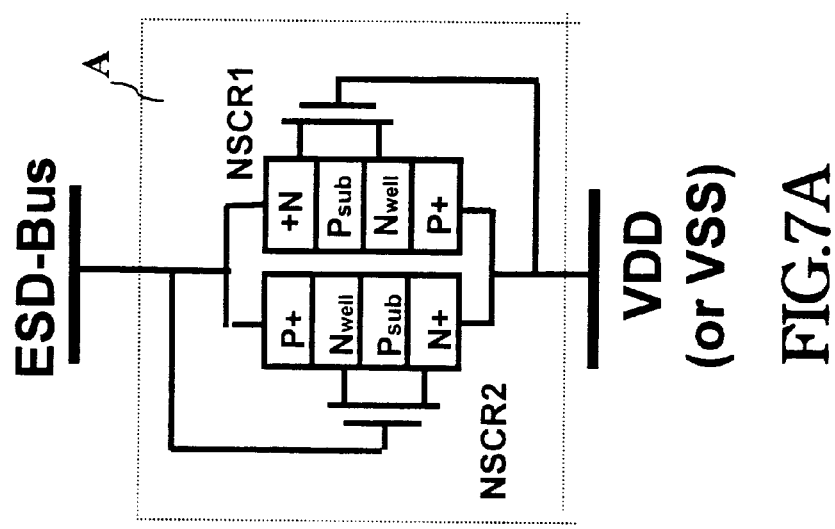
FIG.7B
FIG.7A

ESD BUS LINES IN CMOS IC'S FOR WHOLE-CHIP ESD PROTECTION

FIELD OF THE INVENTION

The present invention relates to an ESD protection scheme in integrated circuits, and more specifically, to ESD bus lines used in integrated circuits for whole-chip ESD protection.

BACKGROUND OF THE INVENTION

In advanced very-large-scale integrated circuits, the power lines of circuits are separated to avoid noise coupling and to reduce ground bouncing for high-performance circuit operation. However, according to previous investigation integrated circuits with separated power pins and separated power lines [1]–[4] interface circuits are more sensitive to ESD (electrostatic-discharge) damage, even if suitable, ESD protection circuits are placed around the input and output pads of the circuits.

[1] N. Maene, J. Vandenbroeck, and L. Bempt, "On chip electrostatic discharge protections for inputs, outputs, and supplies of CMOS circuits," Proc. of EOS/ESD Symp., 1992, pp. 228–233.

[2] M.-D. Ker and T.-L. Yu, "ESD protection to overcome internal gate-oxide damage on digital-analog interface of mixed-mode CMOS IC's," Journal of Microelectronics and Reliability, vol. 36, no. 11/12, 1996, pp. 1727–1730.

[3] M.-D. Ker, C.-Y. Wu, T. Cheng, M. Wu, T.-L Yu, and A. Wang, "Whole-chip ESD protection for CMOS VLSI/ULSI with multiple power pins," Proc. of 1994 IEEE International Integrated Reliability Workshop, USA, Oct. 16–19, 1994, pp. 124–128.

[4] M.-D. Ker, C.-Y. Wu, H.-H. Chang, and T.-S. Wu, "Whole-chip ESD protection scheme for CMOS mixed-mode IC's in deep-submicron CMOS technology," Proc. of IEEE Custom Integrated Circuits Conference, USA, 1997, pp. 31–34.

ESD stress may occur across any two pins of an integrated circuit (IC). The ESD current may enter into the IC through an input or output pin, and then flow out the IC from another input or output pin. Thus, the pin-to-pin ESD stress has been referred to as an ESD-testing condition. In the pin-to-pin ESD-testing condition, which is found in ESD testing standard [5], a positive or negative ESD voltage is applied to the input or output pin and simultaneously the other input or output pin are grounded. However, all of the VDD and Vss pins are floating. This pin-to-pin ESD testing condition frequently inflicts unexpected ESD damage on internal circuits.

[5] EOS/ESD Standard for ESD Sensitivity Testing, EOS/ESD Association, Inc., NY., 1993.

To avert such unexpected ESD damage on the internal circuits, some approaches try to add a series of diode string between the separated power lines of IC, [6]–[8]. Several U.S. patents and investigations [9]–[16] have reported on a similar design by using diodes', MOS'S, BJT's, or field-oxide devices (or called as Thick-oxide device) to connect the separated power lines of a CMOS IC.

[6] S. Dabral, R. Aslett, and T. Maloney, "Designing on-chip power supply coupling diodes for ESD protection and noise immunity," Proc. of EOS/ESD Symp., 1993, pp. 239–249.

[7] T. Maloney and S. Dabral, "Novel clamp circuits for IC power supply protection," Proc. of EOS/ESD Symp., 1995, pp. 1–12.

[8] H. Nguyen and J. Walker, "Electrostatic discharge protection system for mixed voltage application specific integrated circuit design," U.S. Pat. No. 5,616,943, April, 1997.

[9] J. Kuo, "ESD protection scheme," U.S. Pat. No. 5,196,981, March, 1993.

[10] J. Leach, "Method of forming an electrostatic discharge protection circuit," U.S. Pat. No. 5,290,724, March, 1994.

[11] W. Miller, "Electrostatic discharge protection for CMOS integrated circuits," U.S. Pat. No. 5,301,084, April, 1994.

[12] W. Reczek and H. Terletzki, "Integrated semiconductor circuit with ESD protection," U.S. Pat. No. 5,426,323, June, 1995.

[13] T. Maloney, "Electrostatic discharge protection circuits using biased and terminated PNP transistor chains," U.S. Pat. No. 5,530,612, June, 1996.

[14] S. Voldman, "Power sequence independent electrostatic discharge protection circuits," U.S. Pat. No. 5,610,791, March, 1997.

[15] S. Voldman, "Voltage regulator bypass circuit," U.S. Pat. No. 5,625,280, April, 1997.

[16] E. Worley, et al., "Sub-micron chip ESD protection schemes which avoid avalanching junction," Proc. Of EOS/ESD Symp., 1995, pp. 13–20.

FIG. 1 depicts the typical design of ESD protection circuits according to prior art. An IC comprises of circuit I and circuit II. Protected by ESD protection devices, circuit I and circuit II are internal circuits of integrated circuits.

Power line VDD, and power line $V_{SS1}$ are coupled with circuit I and is indicated as the power supplies of circuit I.

According to prior art illustrated in FIG. 1, power line $V_{DD1}$ is coupled with power line $V_{DD2}$ through a diode string 600 and power line $V_{SS1}$ is coupled with the power line $V_{SS2}$ through a diode string 500. The number of diodes in the diode strings depends on the voltage level or the noise level between the separated power lines. The additional diode strings between the separated power lines are designed to conduct the ESD current between the separated power lines to avert the ESD damage incurred at the internal circuits when the IC is under the ESD stress condition. However, when the IC is under normal operating conditions with the normal supplies, the diode string is designed to block the voltage or noise between the separated power lines. If the IC has much more separated power lines in the chip, bi-directional diode strings must be added between every two adjacent power lines. FIG. 2 shows a typical example using the bi-directional diode strings to connect the separated power lines of the CMOS IC with four circuitry.

FIG. 2 also contains four circuitry with four separated power pairs in the drawing. Circuit I is supplied by $V_{DD1}$ and $V_{SS1}$. Circuit II is supplied by $V_{DD2}$ and $V_{SS2}$. Circuit III is supplied by $V_{DD3}$ and $V_{SS3}$. Circuit IV is supplied by $V_{DD4}$ and $V_{SS4}$. Bi-directional diode strings 500 are therefore added between $V_{DD1}$ and $V_{DD2}$, between $V_{DD2}$ and $V_{DD3}$, and between $V_{DD3}$ and $V_{DD4}$. Bi-directional diode strings 500 are also added between $V_{SS1}$ and $V_{SS2}$, between $V_{SS2}$ and $V_{SS3}$, and between $V_{SS3}$ and $V_{SS4}$. Such bi-directional diode strings 500 provide the ESD-current conducting path between the separated power lines when the IC is under ESD-stress conditions. An example of the pin-to-pin ESD-stress condition can be found in FIG. 2, in which a positive ESD voltage is attached to input pad 100 of circuit I. However, input pad 100 of circuit IV is relatively grounded. During this pin-to-pin ESD stress, the positive ESD voltage/ current is initially conducted into the $V_{DD1}$ (or $V_{SS1}$) through diode Dp1 (Dn1) in input ESD protection circuit on input pad 100 of circuit I. Such ESD voltage/current on the $V_{DD1}$ ($V_{SS1}$) is conducted into the $V_{DD2}$ ($V_{SS2}$) through the diode string between the $V_{DD1}$ and $V_{DD2}$ ($V_{SS1}$ and $V_{SS2}$). According to the dashed lines in FIG. 2, $I_{ESD}$ is then conducted into the $V_{DD4}$ (or $V_{SS4}$) through the diode strings 500 between the separated power lines of the IC. Finally, the ESD voltage/current is discharged from grounded input pad 100 of circuit IV to the ground through the diodes Dp4 or Dn4 of the input ESD protection circuit on the input pad 100. According to FIG. 2, the ESD current must be discharged through at least three diode strings, before the ESD current emits from grounded input pad 100 of circuit IV. Consider a situation in which the IC has a large number of separated power lines to supply a large number of different circuitry. The larger the number of diode strings in the ESD-current discharging path implies a longer discharging delay to bypass the ESD current away from the integrated circuits through these diode strings. Therefore, the integrated circuit may still occure ESD damage. Therefore, the ESD protection design concept of FIG. 1 is no longer appropriate for the VLSI circuit, which has a large number of separated power lines.

SUMMARY OF THE INVENTION

The present invention discloses an apparatus of preventing integrated circuits from interfering by electrostatic-discharge (ESD). The apparatus comprises of a plurality of internal circuits and each of the internal circuits having input pads and output pads. Input signals are input into the plurality of internal circuits from the input pads and the plurality of internal circuits output outputting signals from the output pads. Each of the internal circuits is coupled with a first power line and a second power line. A first ESD bus is coupled with the plurality of first ESD bi-directional connection devices. A second ESD bus is coupled with the second power line of the plurality of internal circuits through the first power line through the plurality of second ESD bi-directional connection devices. An ESD clamp device is coupled with the first ESD bus and the second ESD bus for discharging the ESD current across these two ESD buses.

BRIEF DESCRIPTION OF THE DRAWINGS

The foregoing aspects and many of the attendant advantages of this invention will become more readily appreciated as the same becomes better understood by referencing to the following detailed description, when taken in conjunction with the accompanying drawings, wherein:

FIG. 7A shows a schematic diagram of a bi-directional ESD connection cell, which is consisted of NSCR1 and NSCR2 devices in accordance with the present invention;

FIG. 7B shows a cross sectional view of a bi-directional ESD connection cell, NSCR1 and NSCR2 devices are fabricated on a P-type substrate in accordance with the present invention;

DETAILED DESCRIPTION OF THE PREFERRED EMBODIMENT

In this invention, a whole-chip ESD protection scheme with ESD buses is proposed to resolve the ESD protection issue of the IC having a large number of separated power lines. Formed by wide metal lines, multiple ESD buses are added into the IC having a large number of separated power lines. The bi-directional ESD-connection cells are connected between the separated power lines and the ESD buses, but not between the separated power lines. The ESD current on the CMOS IC with more separated power lines is conducted into the ESD buses through the bi-directional ESD connection cells. Therefore the ESD current can be conducted by the ESD buses distant from the internal circuits of the IC and quickly discharged through the designed ESD protection device to ground. By applying this novel whole-chip ESD protection scheme with the ESD buses, the CMOS IC having more separated power lines can still be safely protected against ESD damages.

A. Circuit Configuration of this Invention

Figure 3:
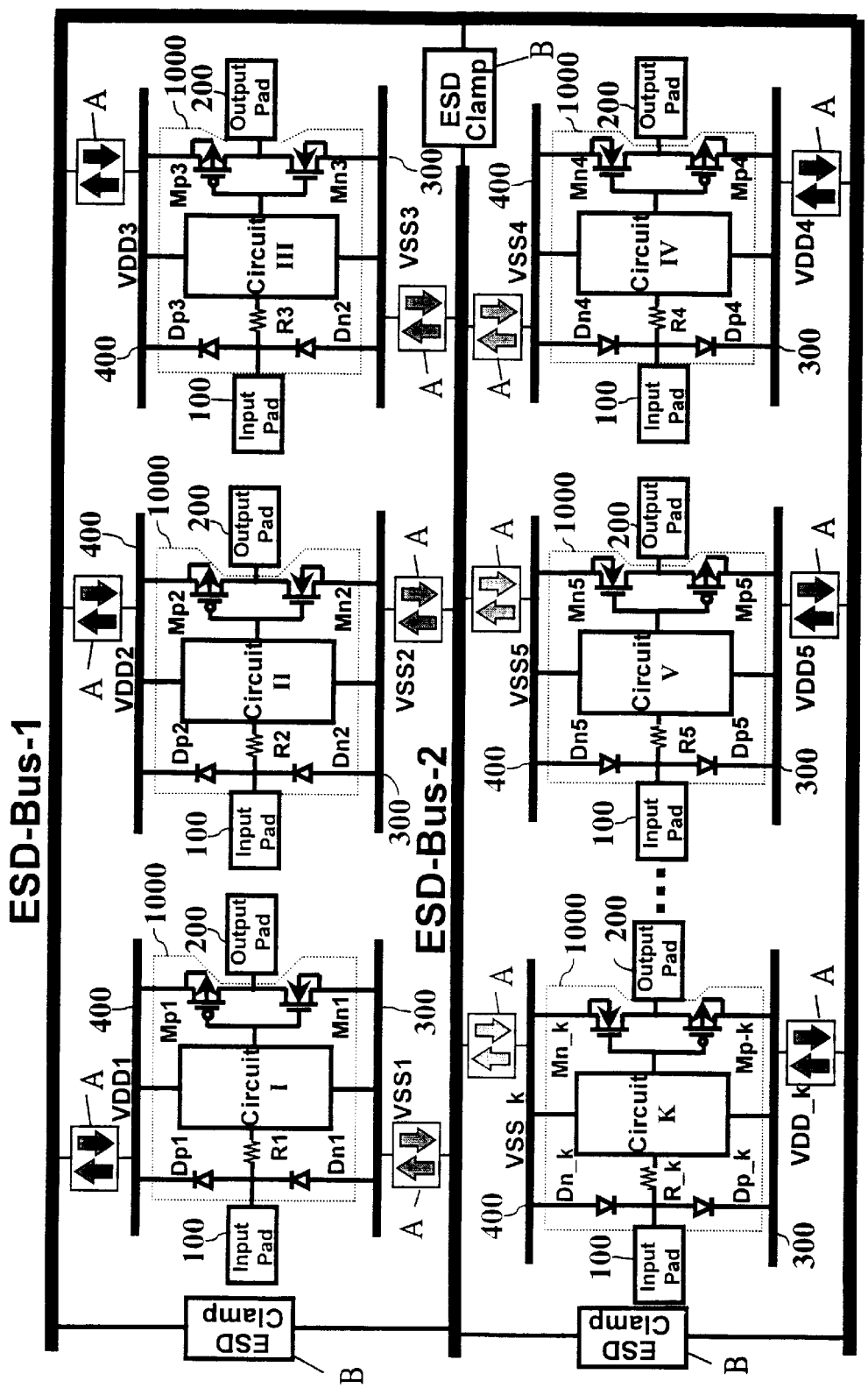
FIG. 3 shows a schematic diagram of an ESD protection scheme with ESD buses connecting to power lines in accordance with the present invention.

According to FIG. 3, the CMOS IC has k circuitry with k separated power lines. Circuit I is supplied by $V_{DD1}$ and $V_{SS1}$ power lines. Circuit II is supplied by $V_{DD2}$ and $V_{SS2}$ power lines. Circuit III is supplied by $V_{DD3}$ and $V_{SS3}$ power lines. Circuit IV is supplied by $V_{DD4}$ and $V_{SS4}$ power lines. Circuit V is supplied by $V_{DD5}$ and $V_{SS5}$ power lines. Circuit K is supplied by $V_{DD\_k}$ and $V_{SS\_k}$ power lines. Circuit I to K are internal circuits, which are protected by ESD protection devices.

Figure 1:
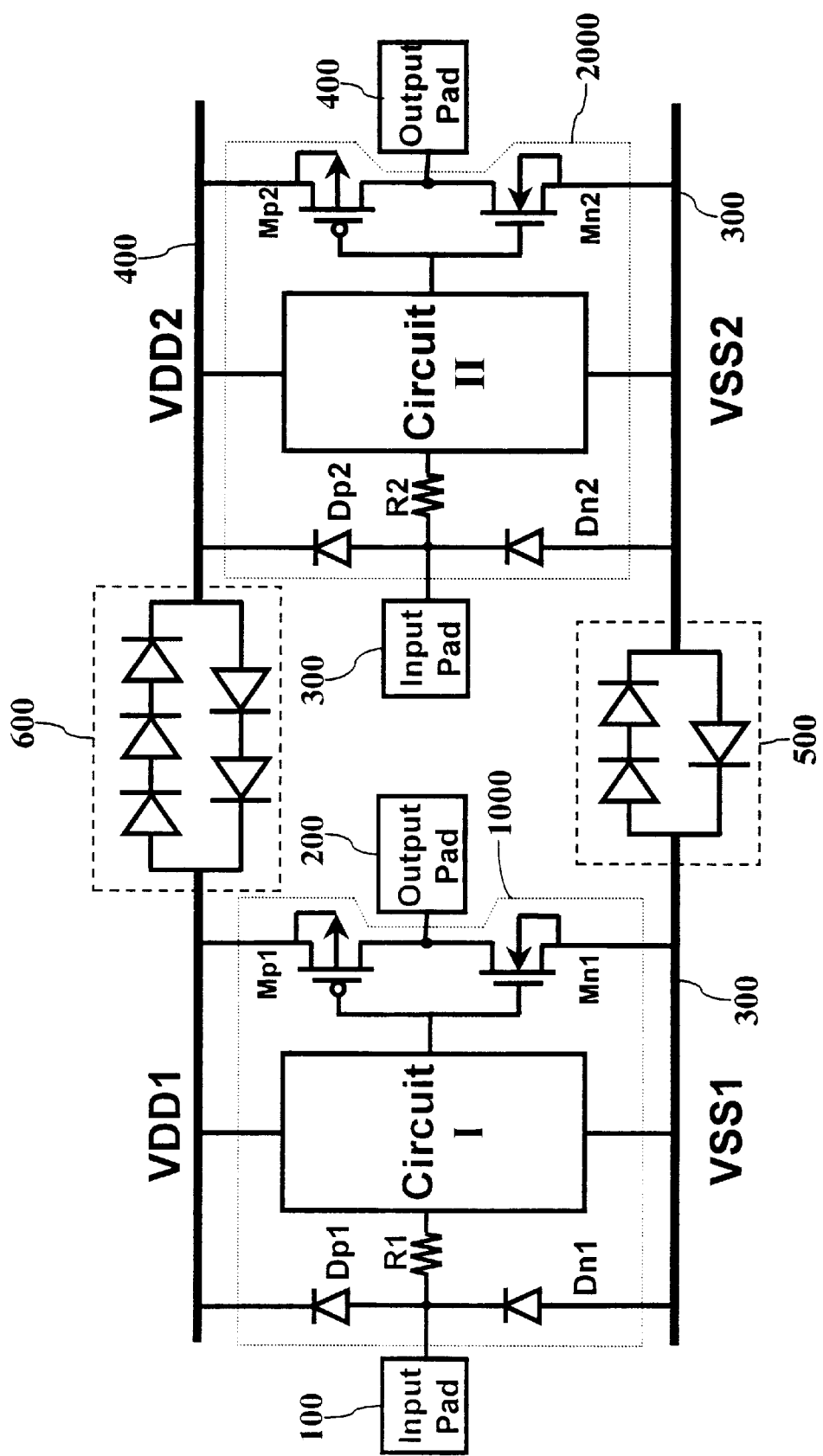
FIG. 1 shows a schematic diagram of an ESD protection circuit with diode strings between separated power lines in accordance with prior art.
Figure 2:
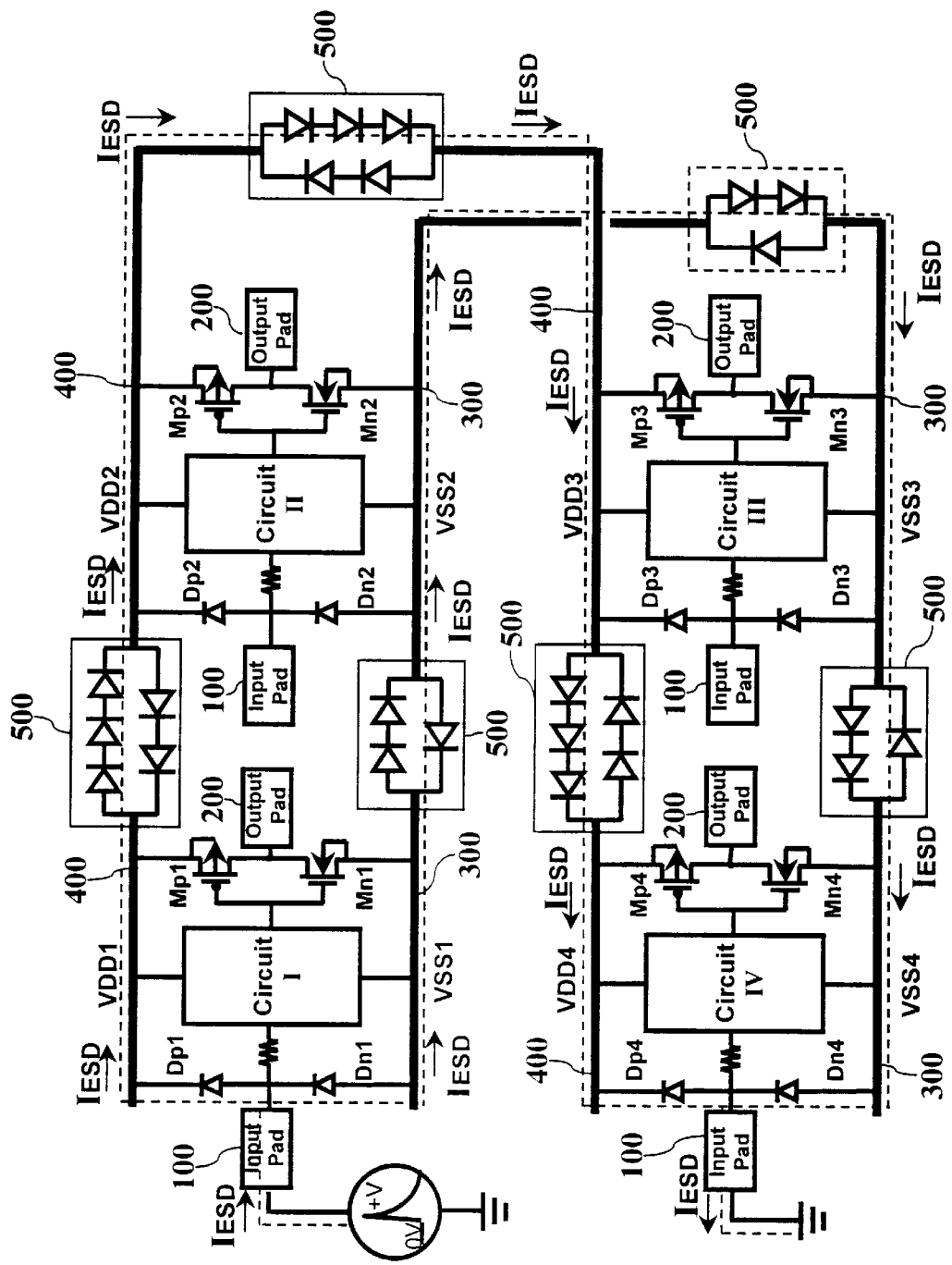
FIG. 2 shows a schematic diagram of an ESD protection circuit with diode strings between multiple separated power lines in accordance with prior art.

All internal circuits receive signals introduced from the input pad 100. Besides, an input ESD protection circuit is used to protect the input pad 100. According to FIG. 3, a diode Dp1 and a diode Dn1 form the input ESD protection circuit. A resistor R (R1, . . . , or $R_{13}$ k) is connected between internal circuits and the input pads. Each internal circuit outputs a signal from an output pad 200. A CMOS output buffer, consisting of a PMOS device and an NMOS device, drives output pad 200. In addition, output PMOS and NMOS simultaneously also serve as output ESD protection devices. The bi-directional ESD connection device A is connected between the $V_{DD}$ of each integrated circuit and ESD-Bus-1. The bi-directional ESD-connection cell A is connected between the $V_{SS}$ power line and ESD-Bus-2. In the circuit K, $V_{DD\_k}$ is connected to the ESD-bus-1 through the bi-directional ESD-connection cell A; in addition, $V_{SS\_k}$ is connected to ESD-bus-2 through the bi-directional ESD-connection cell A. All $V_{DD}$ power lines of the internal circuits in the integrated circuits with separated power lines are connected to ESD-Bus-1 through the bi-directional ESD-connection cells A, whereas all Vss power lines of the internal circuits are connected to ESD-Bus-2 through the bi-directional ESD-connection cells A. In marked contrast to the design in FIG. 1, the bi-directional ESD-connection cells A are all connected from the separated power lines to ESD-Bus-1 or ESD-Bus-2. ESD-Bus-1 and ESD-Bus-2 are formed by using the wide metal lines with high conductivity. When an ESD voltage/current occurs, a path is formed between the first ESD bus and the second ESD bus, and ESD voltage/current is output. For normal operation of the ICs, the ESD clamping circuits turn off to block the current path between the first ESD bus and the second ESD bus. Therefore, no current loss occurs between the ESD buses.

According to FIG. 3, the fact that ESD-Bus-1 is connected to all the $V_{DD}$ power lines of the integrated circuits accounts for why the voltage level on ESD-Bus-1 is charged the same as the VDD voltage level of the integrated circuit. That is, when the IC is under normal operating conditions. ESD-Bus-2 is connected to all $V_{SS}$ power lines of the IC. Correspondingly, when the IC is under normal operating conditions the voltage level on the ESD-Bus-2 is also charged as the IC. The ESD clamp devices B between ESD-Bus-1 and ESD-Bus-2 are designed to be kept off when the IC is under normal operating conditions. Therefore, no current loss occurs from ESD-Bus-1 to ESD-Bus-2. The added ESD-Bus-1, ESD-Bus-2, bi-directional ESD-connection cells A, and ESD clamp devices B in FIG. 3 do not affect the normal operating functions of the IC with multiple separated power lines.

However, when the IC is under ESD-stress conditions, the added ESD-Bus-1, ESD-Bus-2, bi-directional ESD connection cells A, and ESD clamp devices B in FIG. 3 can provide a high-conductivity path to quickly by pass the ESD current away from the internal circuits of the IC with multiple power lines. Therefore, the ICs and the interface circuits could not be accidentally destroyed by ESD pulses. For example, if a positive ESD voltage is attached to input pad 100 of circuit I in FIG. 3, whereas input pad 100 of circuit K is relatively grounded. The ESD current is conducted into the $V_{DD1}$ power line through diode Dp1 in the input ESD protection circuit of circuit I. The ESD current on the $V_{DD1}$ power line is then conducted into ESD-Bus-1 through the bi-directional ESD connection cell A. Next, the ESD current is discharged into ESD-Bus-2 through the ESD clamp device B between ESD-Bus-1 and ESD-Bus-2. The ESD current on ESD-Bus-2 is then conducted into the $V_{SS\_k}$ power line of circuit K through the bi-directional ESD-connection cell A. Finally, the ESD current on the $V_{SS\_k}$ power line is discharged through diode Dn_k in the ESD protection circuits of the k-th circuit to the grounded input pad 100. Therefore, the ESD current is bypassed at most through two bi-directional ESD-connection cells A and an ESD clamp device B between ESD-Bus-1 and ESD-Bus-2. In addition, any accident ESD damage issue can not occur between the ICs or internal circuits, even if the IC has many separated power lines. As generally known, the bi-directional ESD-connection cells A can provide high conductive paths between separated power lines and ESD buses. Therefore, the ESD current can be quickly conducted into ESD buses away from the input pads 100 or the output pads 200 of the IC. The ESD buses are made by the wide metal lines, thereby allowing the ESD buses to quickly conduct the ESD current around the chip to the desired discharge point. To enhance the discharge speed of the ESD current from the abovementioned path, a speed-efficient ESD clamp device B should be designed to quickly bypass the ESD current from ESD-Bus-1 to ESD-Bus-2. The following descriptions illustrate the speed-efficient ESD clamp circuit. In sum, this proposed whole-chip ESD protection scheme with the ESD buses can provide more effective ESD discharging paths to the IC with a large number of separated power lines. Moreover, it prevents ESD damages in the internal circuits.

B. Modified Designs of this Invention

Figure 4:
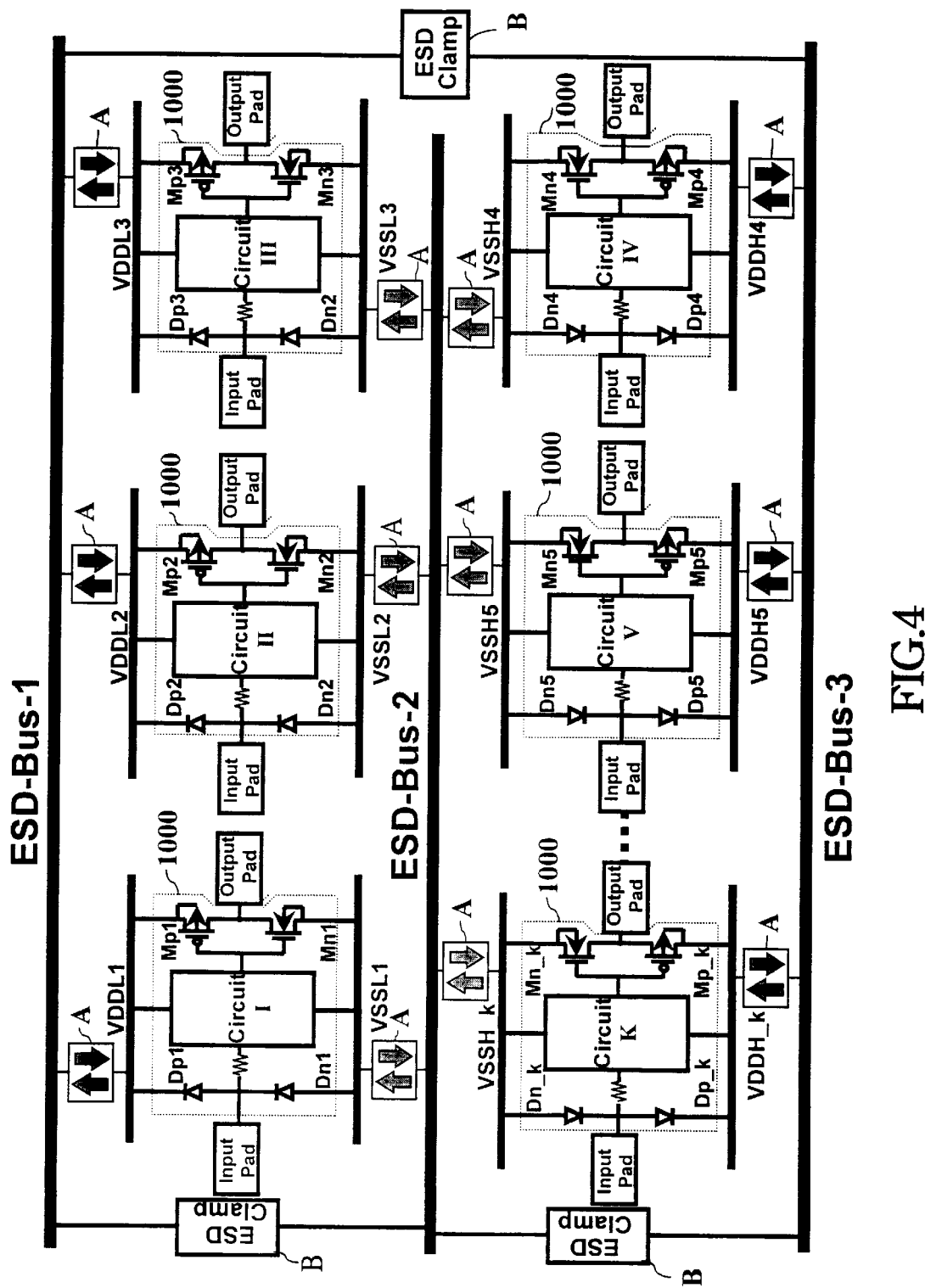
FIG. 4 shows a schematic diagram of a circuit on a chip with a plurality of ESD buses connecting to power lines by using a plurality of bi-directional ESD connection cell, and ESD clamp devices is between the ESD buses in accordance with the present invention.

The whole-chip ESD protection scheme with the ESD buses can also be applied to the IC with mixed-voltage power supplies. FIG. 4 shows the design example, where the ICs have two-group circuitry. One group circuitry has low $V_{DD}$ power supplies ($V_{DDL1}$, $V_{DDL2}$ and $V_{DDL3}$) and low $V_{SS}$ power supplies ($V_{SSL1}$, $V_{SSL2}$ and $V_{SSL3}$). The other has high $V_{DD}$ power supplies ($V_{DDH4}$, $V_{DDH5}$, . . . , and $V_{DDH\_k}$) and high $V_{SS}$ power supplies ($V_{SSH4}$, $V_{SSH5}$, . . . , and $V_{SSH\_k}$). Under this condition, three ESD buses are used to configure the whole-chip ESD protection scheme, as illustrated in FIG. 4. ESD-Bus-1 is used to connect the low $V_{DD}$ power supplies ($V_{DDL1}$, $V_{DDL2}$ and $V_{DDL3}$) through the bi-directional ESD-connection cells A. ESD-Bus-3 is used to connect the high $V_{DD}$ power supplies ($V_{DDH4}$, $V_{DDH5}$, . . . , and $V_{DDH\_k}$) through the bi-directional ESD-connection cells A. Because the $V_{SS}$ power supplies are all ground, the ESD-Bus-2 is used to connect all the $V_{SS}$ power lines ($V_{SSL1}$, $V_{SSL2}$, $V_{SSL3}$, $V_{SSH4}$, $V_{SSH5}$, ..., and $V_{SSH\_k}$) of these two group circuitry through the bi-directional ESD-connection cells A. To quickly conduct the ESD current between ESD-Bus-1, ESD-Bus-2 and ESD-Bus-3, three speed-efficient ESD clamp devices B are placed between the ESD buses. The ESD clamp devices B between the ESD buses are designed to block the current paths between the ESD buses when the IC is under normal operating conditions with the normal power supplies. However, these ESD clamp devices B are also designed to provide a low-impedance path to quickly conduct the ESD current between the ESD buses when the IC is under ESD-stress conditions. These ESD clamp devices B can be effectively designed through appropriate circuit design, as presented later. Through the arrangement with three ESD buses in FIG. 4, this proposed whole-chip ESD protection scheme with the ESD buses can still effectively protect the IC with mixed-voltage and multiple separated power lines.

Figure 5:
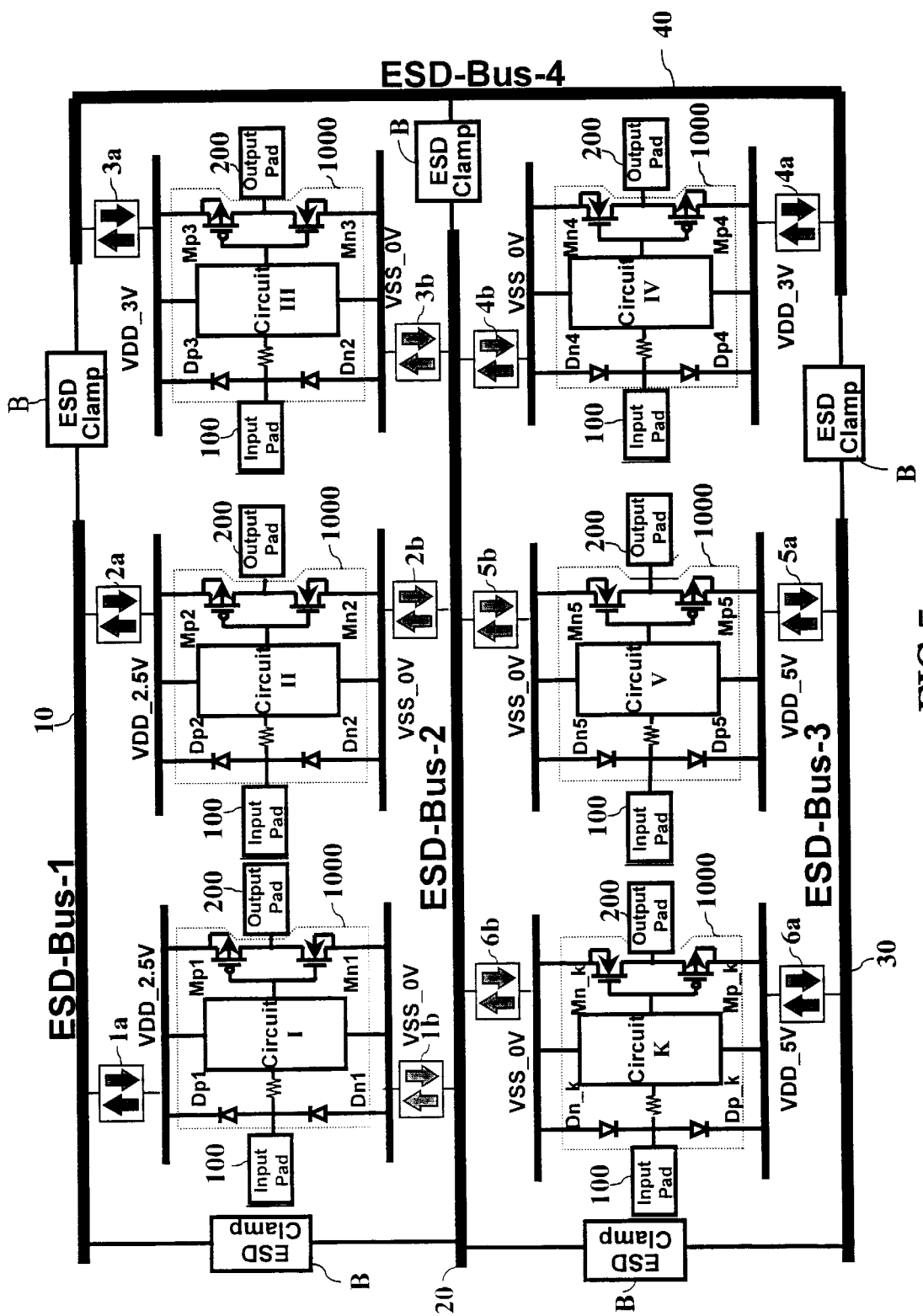
FIG. 5 shows a schematic diagram of an integrated circuit, the power lines in the circuits comprises 5-V, 3-V, 2.5-V and 0-V power lines and four ESD buses to achieve the whole-chip ESD protection in accordance with the present invention.

For an IC with a significant amount of mixed-voltage power supplies, this proposed whole-chip ESD protection scheme with ESD buses can be extended to protect such an IC. FIG. 5 shows the application example, where the IC has three $V_{DD}$ power supplies (2.5V, 3V and 5V). According to FIG. 5, although circuit I and circuit II are operated with 2.5V $V_{DD}$ power supply, circuit III and circuit IV are operated with 3V $V_{DD}$ power supply. Circuit V to circuit K are operated with 5V $V_{DD}$ power supply. The $V_{SS}$ power supplies of the circuit I to the circuit K are 0V power supplies. In such an IC with such complex power supplies, four ESD buses are used to configure the whole-chip ESD protection scheme as shown in FIG. 5. According to FIG. 5, ESD-Bus-1 is used to connect the $V_{DD\_2.5V}$ power lines of circuit I and circuit II through bi-directional ESD-connection cells A. ESD-Bus-4 is used to connect the $V_{DD\_3V}$ power lines of circuit III and circuit IV through bi-directional ESD-connection cells A. ESD-Bus-3 is used to connect $V_{DD\_5V}$ power lines of circuit V to circuit K through bi-directional ESD-connection cells A. Because the voltage level of $V_{SS}$ power lines between the circuits are all ground, ESD-Bus-2 is used to connect all the $V_{SS\_0V}$ power lines of circuit I to circuit K through bi-directional ESD-connection cells A. Between the ESD buses, five ESD clamp devices B are used to connect ESD-Bus-1, ESDBus-2, ESD-Bus-3 and ESD-Bus-4. Under such an arrangement, this proposed whole-chip ESD protection scheme with the ESD buses can still effectively protect the IC.

C. The Bi-directional ESD-connection Cell and the ESD Clamp Device

Figure 6B:
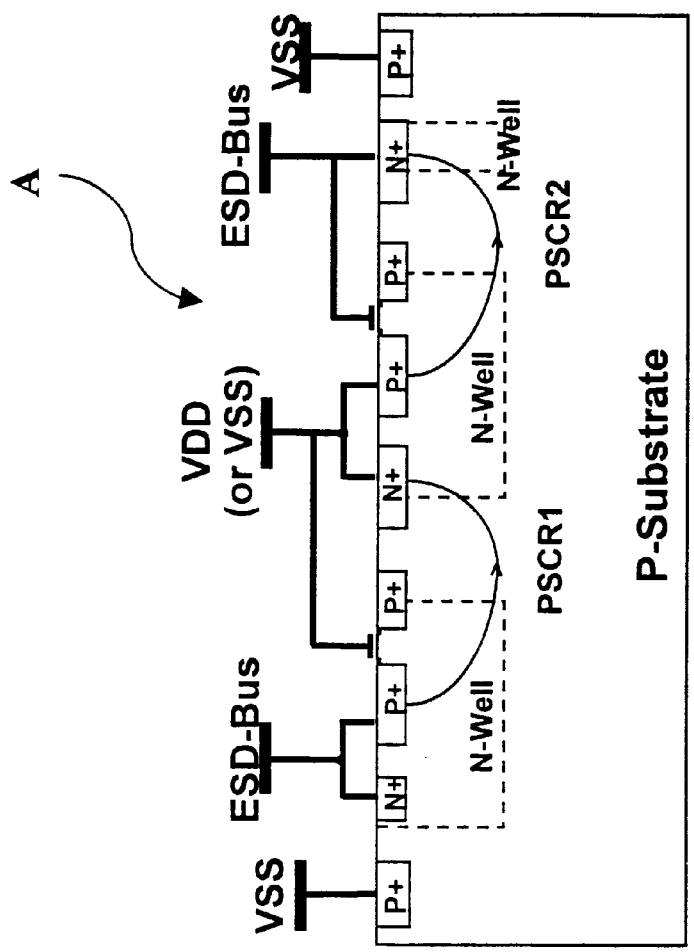
FIG. 6B is a cross sectional view of a bi-directional ESD connection cell, PSCR1 and PSCR2 are constructed on a P-type substrate in accordance with the present invention.
Figure 6A:
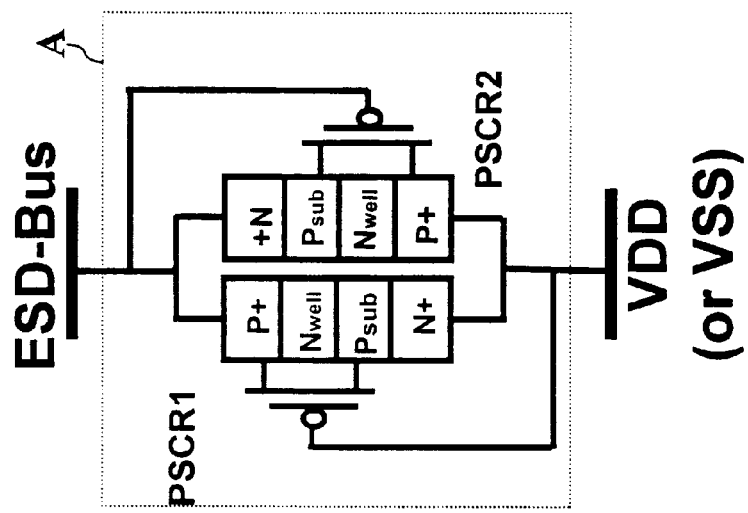
FIG. 6A shows a schematic diagram of a bi-directional ESD connection cell, which is consisted of two PSCR devices in accordance with the present invention.

FIG. 6A and FIG. 7A show the circuit diagrams and device structures of the bi-directional ESD-connection cells A connected from the $V_{DD}$ or $V_{SS}$ power lines to the ESD buses. According to FIG. 6A, two PMOS-triggered SCR (silicon controlled rectifier) devices (PSCR1 and PSCR2), capable of providing bi-directional current paths between the ESD buses and the $V_{DD}$ (or $V_{SS}$) power lines, form the bi-directional ESD-connection cell A. The anode of the PSCR1 is coupled with the cathode of the PSCR2 and with the ESD buses. The cathode of the PSCR1 is coupled with the anode of the PSCR2 and with the $V_{DD}$ or $V_{SS}$ power line. The gates of the PSCR1 and PSCR2 devices are coupled with the cathode of the PSCR1 and PSCR2 devices, respectively.

According to FIG. 6A, if the voltage different from the ESD buses to the $V_{DD}$ (or $V_{SS}$) power line is lower than the threshold voltage of the PMOS, PSCR1 is triggered on to provide a low-impedance path between ESD buses and $V_{DD}$ (or $V_{SS}$) power lines. On the other hand, if the voltage difference from the $V_{DD}$ (or $V_{SS}$) power line to the ESD buses is lower than the threshold voltage of the PMOS, PSCR2 is triggered on to provide a low-impedance path between ESD buses and $V_{DD}$ (or $V_{SS}$) power line. This allows the bi-directional current paths between the ESD buses and the $V_{DD}$ (or $V_{SS}$) power lines to achieve the whole-chip ESD protection scheme. FIG. 6B displays a cross sectional view of a p-type substrate. In addition, an ESD bi-directional connection device A is fabricated on the substrate.

According to FIG. 7A, two NMOS-triggered SCR devices (NSCR1 and NSCR2), capable of providing bi-directional conducting paths between the ESD buses and the $V_{DD}$ (or $V_{SS}$) power lines, form another type of the ESD bi-directional connection cell A. The anode of the NSCR1 is coupled with the cathode of the NSCR2 and with the $V_{SS}$ or $V_{DD}$ power lines. The cathode of the NSCR1 is coupled with the anode of the NSCR2 and with the ESD buses. The gates of the NSCR1 and NSCR2 devices are coupled with the anode of the NSCR1 and NSCR2 devices, respectively. Referring to FIG. 7B depicts a cross sectional view of the ESD bi-directional connection cell A. The ESD bi-directional connection cell A consisting of NSCR1 and NSCR2, is fabricated on the P-type substrate.

According to FIG. 7A, a situation is considered in which the voltage difference from the ESD buses to the $V_{DD}$ (or $V_{SS}$) power line is greater than the threshold voltage of the NMOS. Under this circumstance, the NSCR2 is triggered on to provide a low-impedance path between ESD buses and $V_{DD}$ (or $V_{SS}$) power line. On the other hand, if the voltage difference from the $V_{DD}$ (or $V_{SS}$) power line to the ESD buses is greater than the threshold voltage of the NMOS, the NSCR is triggered on to provide a low-impedance path between ESD buses and $V_{DD}$ (or $V_{SS}$) power line. This provides the bi-directional current paths between ESD buses and $V_{DD}$ (or $V_{SS}$) power lines to achieve the whole-chip ESD protection scheme. According to FIG. 7B, a cross sectional view of the ESD bi-direction connection cell B according to FIG. 7A is shown. The ESD bi-direction connection cell B, which consists of NSCR1 and NSCR2, is fabricated on a P-type substrate.

Figure 8:
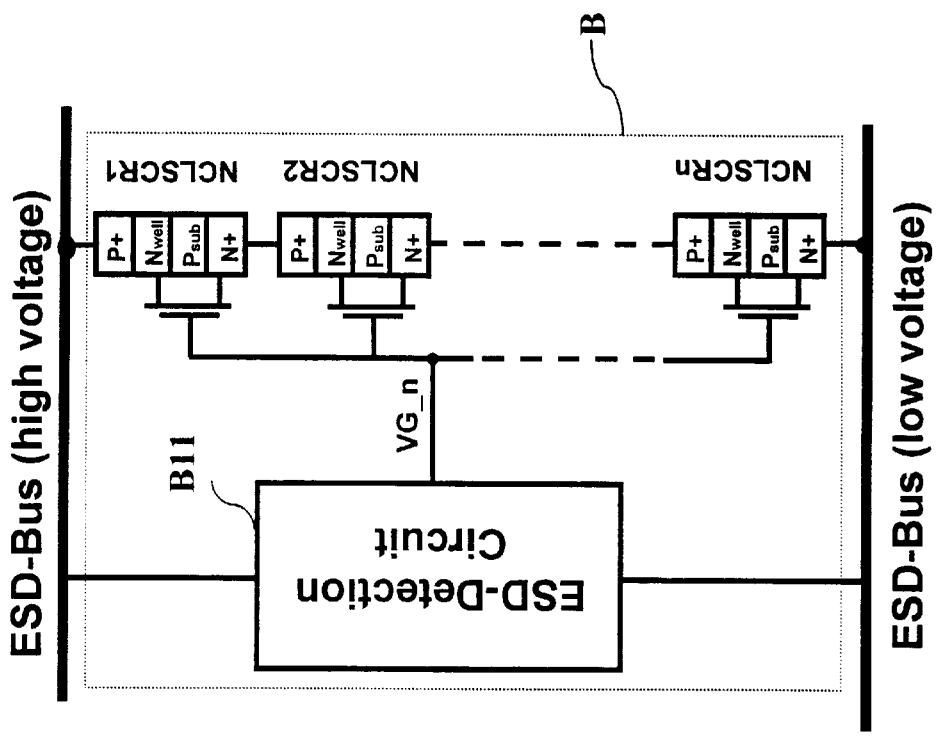
FIG. 8 shows a schematic diagram of an ESD clamp, which comprises an ESD-detection circuit and several NCLSCR devices in accordance with the present invention.
Figure 9:
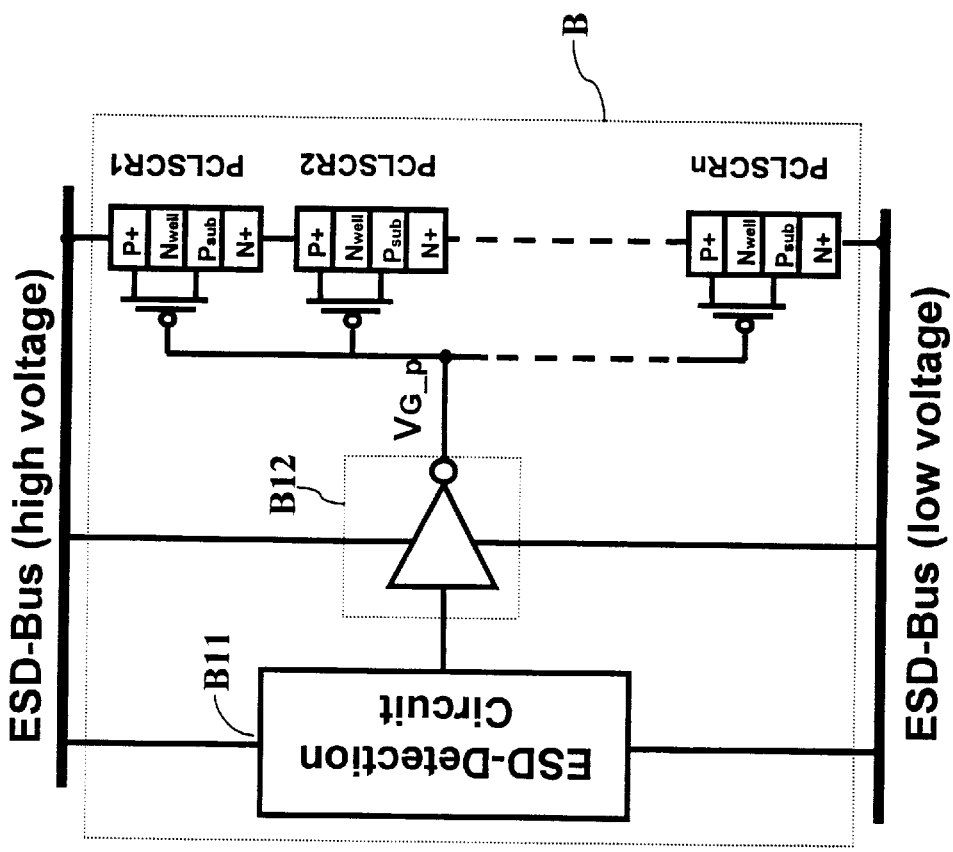
FIG. 9 shows a schematic diagram of an ESD clamp device that comprises an ESD-detection circuit and several PCLSCR devices, and the gates of the PCLSCR devices connect to the ESD detection circuit through a reverting device in accordance with the present invention.

FIG. 8 and FIG. 9 show the ESD clamp devices B between the ESD buses of different voltage levels. The ESD clamp devices B are designed to provide quickly discharging paths from ESD buses of high voltage to ESD buses of low voltage, when the IC is under the ESD-stress conditions. However, the ESD clamp devices B must be kept off to block the current paths between the ESD buses of high voltage and the ESD buses of low voltage, when the IC is under normal operating conditions. To achieve such a requirement, FIG. 8 shows a practical design of the speed-efficient ESD clamp devices B. According to this figure, a plurality of NMOS-controlled lateral SCR's (NCLSCR's) is formed in cascode configuration from ESD buses of high voltage to ESD buses of low voltage. The NCLSCRs are comprised of NCLSCR1 to NCLSCRn and these NCLSCR devices are coupled in a series. The anode of NCLSCR's is coupled with the ESD bus of high voltage and the cathode of NCLSCR's is coupled with the ESD bus of low voltage. An ESD-detection circuit B11 controls the gates of the NMOSs in NCLSCRs. In addition, the ESD-detection circuit B11 is coupled with the ESD bus of high voltage between the ESD bus of low voltage. When the ESD voltage/current occurs across the ESD clamp device B, the ESD-detection circuit B11 quickly generates a voltage level greater than the NMOS turn-on voltage to turn on the cascoded NCLSCR's. However, when the IC is under the normal operating conditions, the voltage level on the node VG_n according to FIG. 8 is maintained at the voltage level of ESD buses of a low voltage. Thus, the NMOSs in the NCLSCRs are kept off and, then, the cascoded NCLSCRs are guaranteed to be off to block the current path between ESD buses of high voltage and ESD buses of a low voltage. The number (n) of NCLSCR devices in the cascoded NCLSCRs between the ESD buses of a high voltage and ESD-Bus of a low voltage can be calculated as $n \geq (V_{diff}/V_{hold})$. Notably, $V_{diff}$ is the voltage difference from the ESD buses of a high voltage to ESD buses of a low voltage, when the IC is under the normal operating conditions. The $V_{hold}$ is the holding voltage of the NCLSCR device, which is typically about ~1 V in the general CMOS technology. For example, according to FIG. 5, ESD-Bus-1 is charged at around 2.5V and the ESD-Bus-2 is charged at around 0V, when the IC is under normal operating conditions. Therefore, ESD clamp device B between ESD-Bus-1 and ESD-Bus-2 is designed with three NCLSCR devices in the cascoded NCLSCR's to block the current path from ESD-Bus-1 to ESD-Bus-2, when the integrated circuit is under normal operating conditions. As the IC is operated under a normal condition, the total voltage of the NCLSCR string in the ESD clamping circuit B is higher than the voltage difference between $V_{DD}$ power line and the $V_{SS}$ power line. Therefore, under this circumstance, the latchup of IC does not occur.

FIG. 9 shows another design on the ESD clamp device B between the ESD buses of high voltage and the ESD buses of low voltage by using the PMOS-controlled lateral SCR devices (PCLSCR's). The PCLSCRs comprise of PCLSCR1 to PCLSCRn. The PCLSCRs are coupled in a series. The anode of the PCLSCR's is coupled with the ESD bus of high voltage and the cathode of the PCLSCRs is coupled with the ESD bus of a low voltage. The gates of PCLSCRs are coupled with the output terminal of an inverter B12. In addition, the input terminal of the inverter B12 is coupled with an ESD-detection circuit B11. The ESD-detection circuit B11 is coupled with the ESD bus of high voltage between to the ESD bus of low voltage. According to FIG. 9, between the ESD-detection circuit B11 and the cascoded PCLSCR's, the inverter B12 is used to transfer the voltage level to correctly control the gate-voltage of the cascoded PCLSCR's. As the ESD voltage/current occurs across between the ESD buses of a high voltage and the ESD buses of a low voltage, the voltage level on the node of VG_p is below the turn-on voltage of the PMOS in the cascoded PCLSCR's to turn on the cascoded PCLSCR's. Therefore, a low-impedance path is formed through the turned-on PCLSCR's between the ESD buses of a high voltage and the ESD buses of a low voltage to achieve the whole-chip ESD protection scheme. Nevertheless, when the IC is under normal operating conditions, the cascoded PCLSCR's are kept off to block the current path between the ESD buses of a high voltage and ESD buses of a low voltage. The number (n) of the PCLSCR devices in the cascoded PCLSCR's between ESD buses of a high voltage and ESD buses of a low voltage is also calculated as $n \geq (V_{diff}/V_{hold})$. Where $V_{diff}$ is the voltage difference from ESD buses of a high voltage to ESD buses of a low voltage, when the IC is under normal operating conditions. The $V_{hold}$ is the holding voltage of the PCLSCR device, which is typically about ~1V in the general CMOS technology. With an appropriate design on the number of the PCLSCR devices in the cascoded PCLSCR's, the VDD-to-VSS latchup problem in the ICs does not occur between ESD buses of a high voltage and ESD buses of a low voltage.

Figure 10:
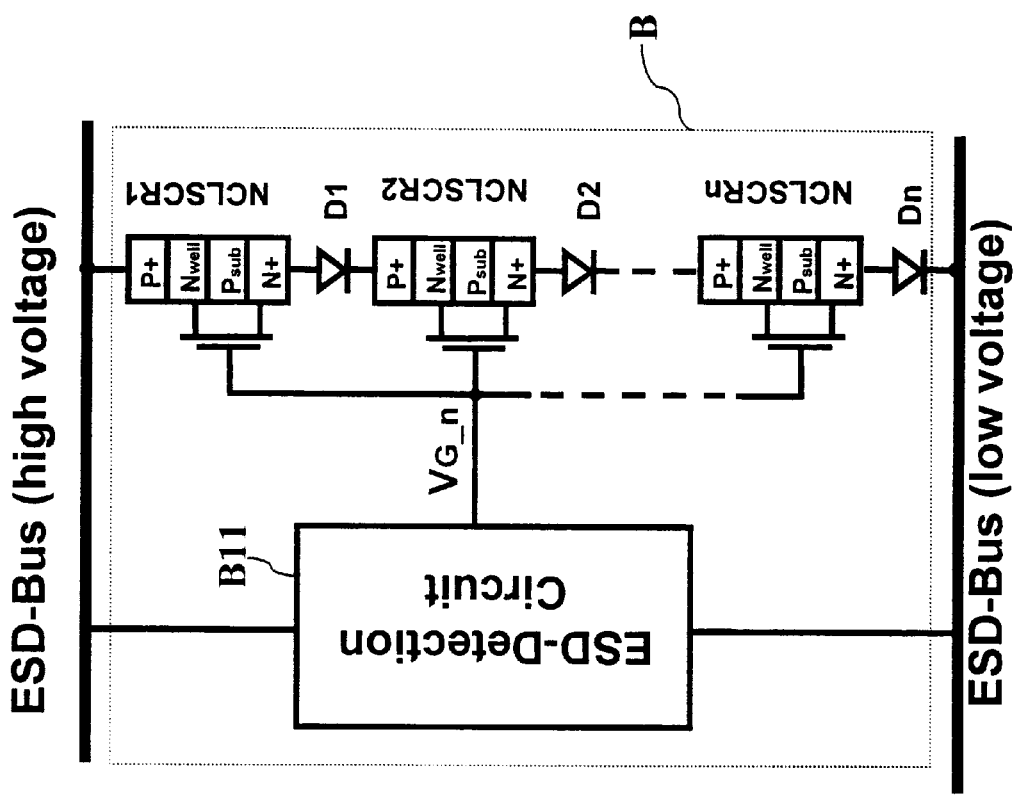
FIG. 10 shows a schematic diagram of an ESD clamp device that comprises of an ESD-detection circuit, several NCLSCR devices and several diodes, and the gates of the NCLSCR devices connect to the ESD-detection circuit in accordance with the present invention.
Figure 11:
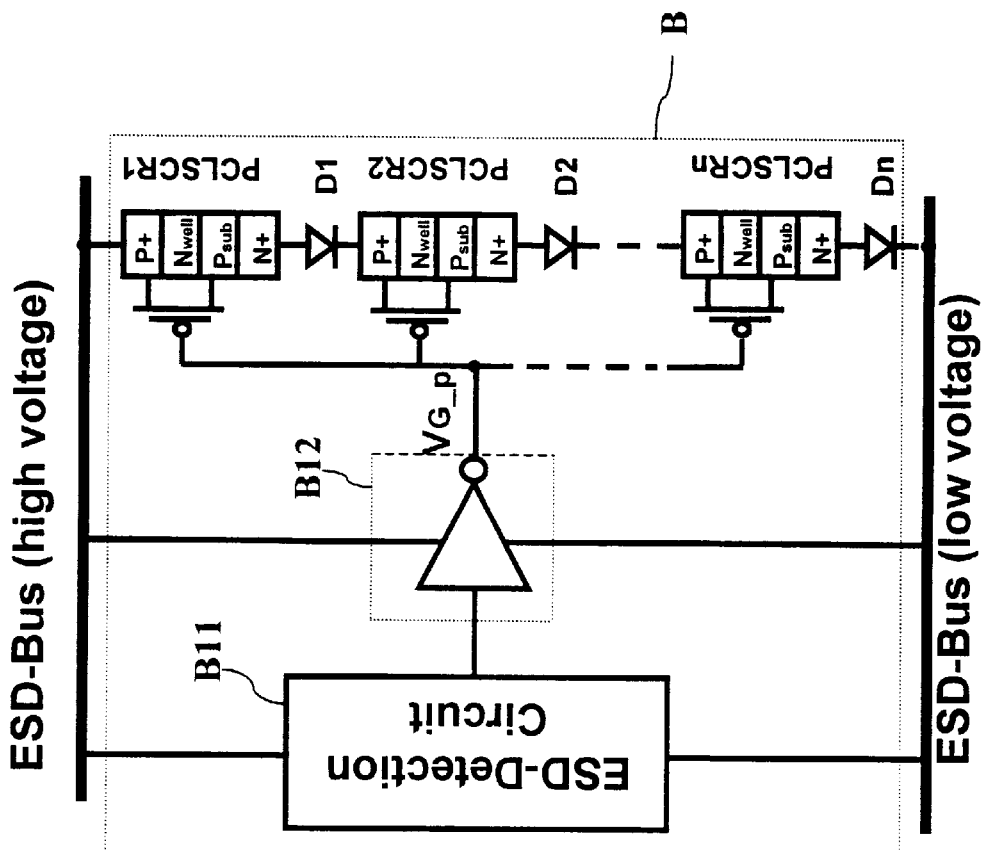
FIG. 11 shows a schematic diagram of an ESD clamp device that comprises an ESD-detection circuit, several PCLSCR devices and several diodes, and the gates of the PCLSCR devices connect to the ESD detection circuit through a reverting device in accordance with the present invention.

FIG. 10 and FIG. 11 show another implementation on the speed-efficient ESD clamp circuit A. According to FIG. 10, diodes are inserted into the cascoded NCLSCR's to reduce the number of NCLSCR devices. The diodes comprise diode D1 to Dn and these diodes are coupled with the NCLSCR devices in a series. The gates of the NCLSCR devices are coupled with the ESD-detection circuit B11 and the ESD detection circuit B11 is coupled with the ESD bus of a high voltage between to the ESD bus of a low voltage. The diode in the forward-biased condition can provide a voltage drop of around ~0.7V. Therefore, the voltage drop across one NCLSCR with one diode is about ~1.7V. The number (n) of the NCLSCR devices with the diodes in the ESD clamp circuit B between the ESD buses of high voltage and the ESD buses of low voltage is calculated as $n \geq (V_{diff}/1.7V)$. Where $V_{diff}$ denotes the voltage difference from the ESD buses of a high voltage to the ESD buses of a low voltage, when the integrated circuit is under normal operating conditions. According to FIG. 11, it is a modified design from that of FIG. 9, where the diodes are inserted into the cascoded PCLSCR's to reduce the number of the PCLSCR devices in the ESD clamp circuit B. With an appropriate design on the number of PCLSCR or NCLSCR devices and diodes in the ESD clamp circuit B, the $V_{DD}$-to-$V_{SS}$ latchup problem in the IC does not occur between ESD buses of a high voltage and ESD buses of a low voltage.

D. Other Application of this Invention with Single ESD Bus

Figure 12:
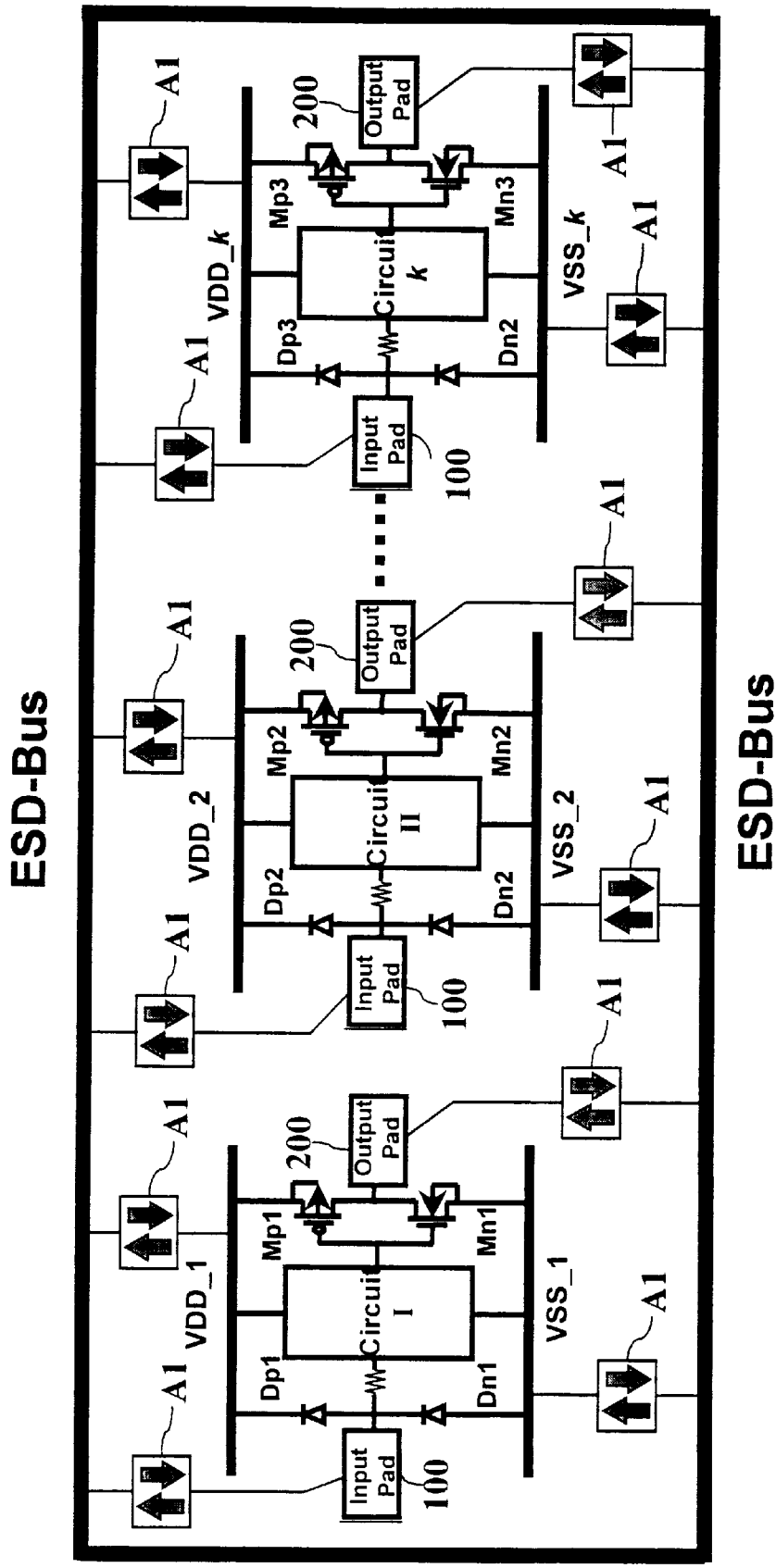
FIG. 12 shows a schematic diagram of a circuit, the integrated circuits has several power lines and a ESD bus is used for whole-chip ESD protection, each of input/output pads and power lines is connected with a bi-directional connection cell connected to the ESD bus in accordance with the present invention.

The whole-chip ESD protection scheme can also be implemented using only one ESD bus, as shown in FIG. 12. An IC comprises of an internal circuit I to an internal circuit III. Each internal circuit has an input pad 100 and an output pad 200. Each internal circuit is supplied by a $V_{DD}$ power line and a $V_{SS}$ power line. The $V_{DD}$ power line is $V_{DD\_1}$, $V_{DD\_2}$ or $V_{DD\_k}$ power line. The $V_{SS}$ power line is $V_{SS\_1}$, $V_{SS\_2}$ or $V_{SS\_k}$ power line. The single ESD-Bus line with a wide metal line surrounds the whole chip to provide the ESD current conducting path away from the internal circuits of the IC to prevent from the ESD current flowing in the internal circuits. All the input pads 100 and output pads 200 of the internal circuits in the IC are coupled with the ESD-Bus line through the modified ESD bi-directional connection cells A1. The separated $V_{DD}$ and $V_{SS}$ power lines are also coupled to the ESD-Bus line through the modified ESD bi-directional connection cells A1. By such an arrangement, the ESD voltage attached at the input pad or the output pad of the IC is first conducted into the ESD-Bus line through the modified ESD bi-directional connection cells A1. Therefore, the ESD current is conducted in the ESD-Bus line. Finally, the ESD current is discharged from the grounded pad to the relatively grounded input or output pad of any circuitry through the modified ESD bi-directional connection cell A1, which is connected between the relatively grounded input or output pad and the ESD-Bus line. The ESD stress across any two pins of the IC with separated power lines and circuitry can be safely protected by using such whole-chip ESD protection scheme with one single ESD-Bus line. This design can also be applied to the IC without the separated power lines or circuitry.

To provide the abovementioned whole-chip ESD protection scheme with one single ESD-Bus line, the modified ESD bi-directional connection cells A1 must be correctly designed to avert the power loss between the input, output, or power pads through the ESD-Bus line, when the IC is under normal operating conditions. FIG. 13, FIG. 14, FIG. 15 and FIG. 16 show the appropriate designs for the modified ESD bi-directional connection cells A1 without causing the power loss between the input, output, or power pads through the ESD-Bus line.

Figure 13:
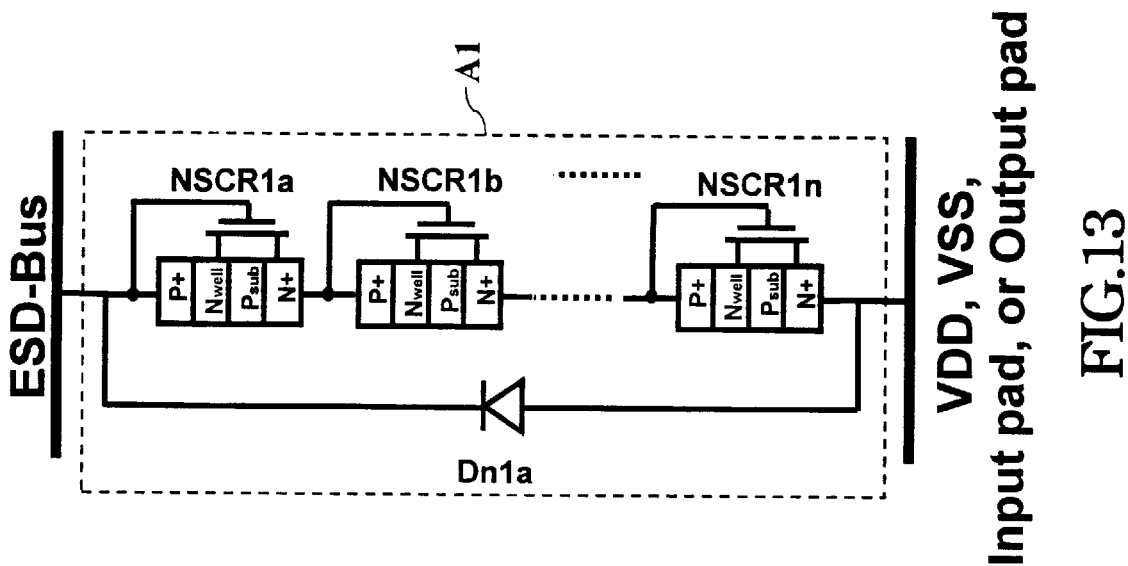
FIG. 13 shows a schematic diagram of an ESD bi-directional connection cell according to FIG. 12, the cell comprises of a diode and several NSCR devices connecting together in parallel in accordance with the present invention.

According to FIG. 13, the modified ESD bi-directional connection cell A1 is formed by applying a diode Dn1a connected from the input pad 100, output pads 200, or $V_{DD}$ and $V_{SS}$ power lines to the ESD-Bus line. However, from the ESD-Bus line to the input pads 100, output pads 200, or $V_{DD}$ and $V_{SS}$ power lines, a plurality of the NMOS-triggered SCR (NSCR) devices, which comprises of NSCR1a to NSCR1n is used and connected in a series configuration. The gate of each of the NSCR's is coupled with the anode of each of the NSCR's, respectively. The number (m) of the NSCR devices in the modified ESD bi-directional connection cell A1 is calculated as $m \geq (V_{DD}-V_{SS})/V_{hold}$ to avert the power loss through the ESD-Bus line. Where $V_{hold}$ denotes the holding voltage of one NSCR device, which is around ~1V in the general CMOS technology.

Figure 14:
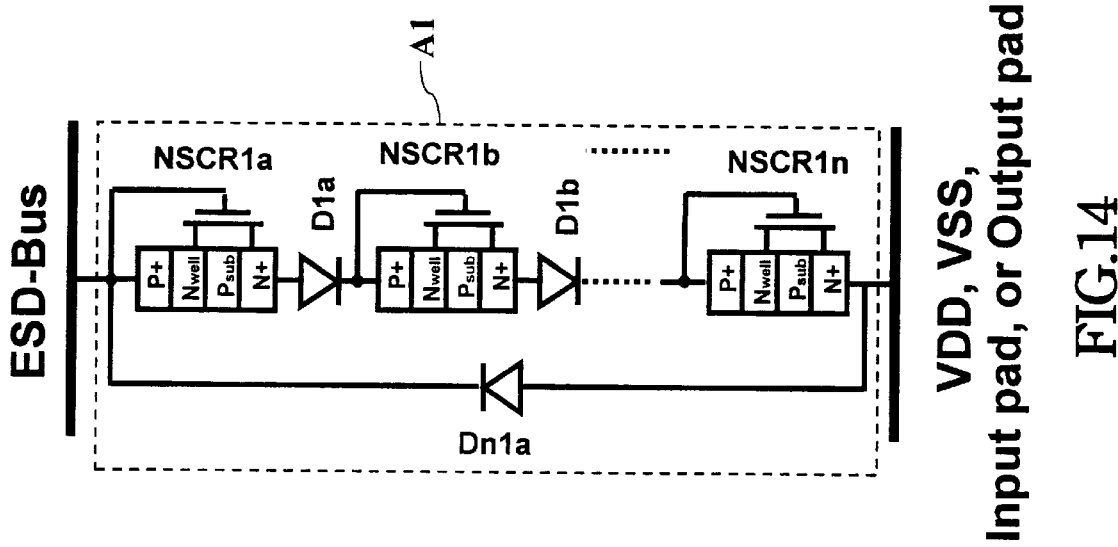
FIG. 14 shows a schematic diagram of an ESD bi-directional connection cell according to FIG. 12, the cell comprises of several diodes and several NSCR devices in accordance with the present invention.

According to FIG. 14, the diodes (D1a, D1b, . . . ) are inserted into the NSCR devices to reduce the number of NSCR devices.

Figure 15:
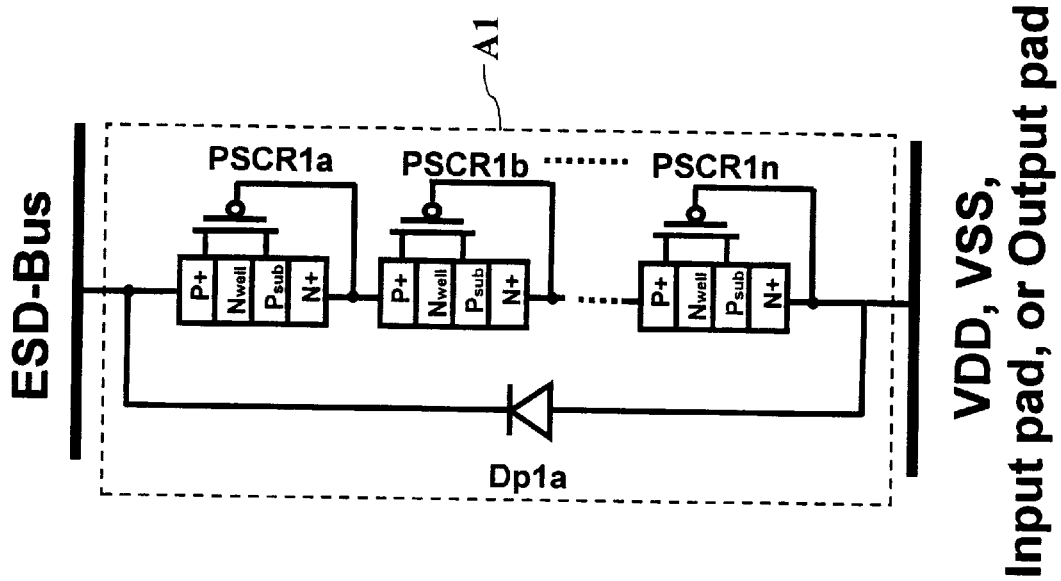
FIG. 15 shows a schematic diagram of an ESD bi-directional connection cell according to FIG. 12, the cell comprises of a diode and several PSCR devices connecting together in parallel in accordance with the present invention.

According to FIG. 15, the PMOS-triggered SCR (PSCR) devices can also be used in the modified ESD bi-directional connection cell A1. A plurality of PSCR's is coupled together in a series and a diode Dp1a is coupled with the plurality of PSCR's in parallel. The anode of the PSCR's is coupled with the ESD bus and the cathode of the diode Dp1a. The cathode of the PSCR's is coupled with the anode of the diode Dp1a, and with the $V_{DD}$, $V_{SS1}$ input pad 100 or output pad 200.

Figure 16:
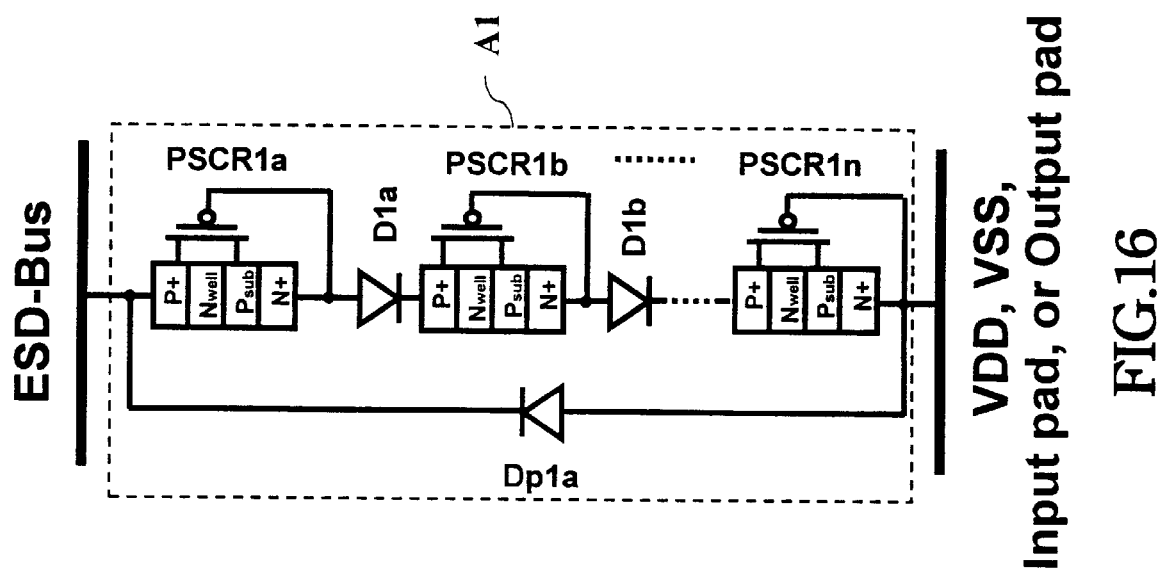
FIG. 16 shows a schematic diagram of an ESD connection cell according to FIG. 12, the cell comprises of several diodes and several PSCR devices in accordance with the present invention.

FIG. 16 shows the merged design with the PSCR devices and diodes in a series configuration from the ESD-Bus line to the input pads 100, output pads 200, or $V_{DD}$ and $V_{SS}$ power lines. The total voltage drop across the series NSCR (or PSCR) devices and the diodes should be greater than the voltage difference between the $V_{DD}$ power line and the $V_{SS}$ power line of the IC in the normal operating conditions to avoid the power loss through the ESD-Bus line.

As understood by a person skilled in the art, the foregoing preferred embodiment of the present invention is illustrative of the present invention rather than limiting the present invention.

While the preferred embodiment of the invention has been illustrated and described, it will be appreciated that various changes can be made therein without departing from the spirit and scope of the invention.

What is claimed is:

1. An apparatus of preventing integrated circuits from interfering by electrostatic-discharge (ESD), wherein said apparatus comprises:
   a plurality of internal circuits, each of said internal circuits having an input pad and an output pad, input signals being input to said plurality of internal circuits from said input pads and output signals being output from said plurality of internal circuits from said output pad, each of said plurality of internal circuits being coupled with a first power line and a second power line;
   a plurality of first ESD bi-directional connection devices;
   a plurality of second ESD bi-directional connection devices;
   a first ESD bus coupled with said plurality of first ESD bi-directional connection devices;
   a second ESD bus coupled with said plurality of second ESD bi-directional connection devices; and
   an ESD clamp device, coupled with said first ESD bus and said second ESD bus for discharging a current caused by said plurality of internal circuits through said plurality of first ESD bi-directional connection device to said first ESD bus, through said plurality of second ESD bi-directional connection to said second ESD bus.

2. The apparatus according to claim 1, wherein each of said first ESD bi-directional connection device, comprises:

a first PSCR (p-type silicon controlled rectifier) device, wherein a gate of said first PSCR device coupled with an cathode of said first PSCR device and an anode of said first PSCR device coupled with said first electrostatic-discharge bus; and a second PSCR device, wherein an anode of said second PSCR device coupled with said cathode of said first PSCR device and to said first power line, a cathode of said second PSCR device coupled with a gate of said second PSCR device.

3. The apparatus according to claim 1, wherein each of said second ESD bi-directional connection devices, comprises:

a first PSCR (p-type silicon controlled rectifier) device, wherein a gate of said first PSCR device coupled with an cathode of said first PSCR device and an anode of said first PSCR device coupled with said second electrostatic-discharge bus; and a second PSCR device, wherein an anode of said second PSCR device coupled with said cathode of said first PSCR device and to said second power line, a cathode of said second PSCR device coupled with a gate of said second PSCR device.

4. The apparatus according to claim 1, wherein each of said first ESD bi-directional connection devices, comprises:

a first NSCR (n-type silicon controlled rectifier) device, wherein a gate of said first NSCR device coupled with an anode of said first NSCR device and a cathode of said first NSCR device coupled with said first electrostatic-discharge bus; and a second NSCR device, wherein a cathode of said second NSCR device coupled with said anode of said first NSCR device and to said first power line, and an anode of said second NSCR device coupled with a gate of said second NSCR device.

5. The apparatus according to claim 1, wherein each of said second ESD bi-directional connection devices, comprises:

a first NSCR (n-type silicon controlled rectifier) device, wherein a gate of said first NSCR device coupled with an a node of said first NSCR device and a cathode of said first NSCR device coupled with said second electrostatic-discharge bus; and a second NSCR device, wherein a cat hode of said second NSCR device coupled with said anode of said first NSCR device and to said second power line, and said anode of said second NSCR device coupled with a gate of said second NSCR device.

6. The apparatus according to claim 1, wherein each of said ESD clamp devices, comprises:

a plurality of NCLSCR (NMOS-controlled lateral silicon controlled rectifier) devices coupled together in a series, wherein said plurality of NCLSCR devices forward coupled with between said first ESD bus and said second ESD bus, and a gate of each of said plurality of NCLSCR devices coupled with a node; and an ESD-detection circuit coupled with said first ESD bus and said second ESD bus, wherein said node coupled with said ESD-detection circuit.

7. The apparatus according to claim 1, wherein each of said ESD clamp devices, comprises:

a plurality of PCLSCR (PMOS-controlled lateral silicon controlled rectifier) devices coupled together in a series, wherein said plurality of PCLSCR devices coupled with said first ESD bus and said second ESD bus, and a gate of each of said plurality of PCLSCR devices coupled with a node;

an ESD-detection circuit coupled with said first ESD bus and said second ESD bus; and an inverter having an input terminal and an output terminal, wherein said input terminal coupled with said ESD-detection circuit and said output terminal coupled with said node.

8. The apparatus according to claim 1, wherein each of said ESD clamp devices, comprises:

a plurality of NCLSCR (NMOS-controlled lateral silicon controlled rectifier) devices coupled together in a series, and each of said plurality of NCLSCR devices coupled with a diode in a series, wherein said plurality of NCLSCR devices forward coupled between said first ESD bus and said second ESD bus and a gate of each of said plurality of NCLSCR devices coupled with a node; and an ESD-detection circuit coupled between said first ESD bus and said second ESD bus, wherein said node coupled with said ESD-detection circuit.

9. The apparatus according to claim 1, wherein each of said ESD clamp devices, comprises:

a plurality of PCLSCR (PMOS-controlled lateral silicon controlled rectifier) devices coupled together in a series and each of said plurality of PCLSCR devices coupled with a diode in a series, wherein said plurality of PCLSCR devices forward coupled with said first ESD bus and said second ESD bus, and a gate of each of said plurality of PCLSCR devices coupled with a node;

an ESD-detection circuit coupled with said first ESD bus and said second ESD bus; and an inverter having an input terminal and an output terminal, wherein said input terminal coupled with said ESD-detection circuit and said output terminal coupled with said node.

10. An apparatus of preventing integrated circuits from interfering by electrostatic-discharge (ESD), wherein said apparatus comprises:

a plurality of first internal circuits, each of said plurality of first internal circuits having an first input pad and an first output pad, input signals being input to said plurality of first internal circuits through said first input pad and output signals being output from said plurality of first internal circuits through said first output pad, each of said plurality of first internal circuits being coupled with a first power line and a second power line;

a plurality of second internal circuits, each of said plurality of second internal circuits having an second input pad and an second output pad, input signals being input into said plurality of second internal circuits from said second input pad and output signals being output from said plurality of second internal circuits through said second output pad, each of said plurality of second internal circuits being coupled with a third power line and a fourth power line;

a plurality of first ESD bi-directional connection devices;

a plurality of second ESD bi-directional connection devices;

a plurality of third ESD bi-directional connection devices, each of said third ESD bi-directional connection devices coupled with one of said plurality of second internal circuits through said third power line;

a plurality of fourth ESD bi-directional connection devices, each of said fourth ESD bi-directional connection devices coupled with one of said plurality of second internal circuits through said fourth power line;

a first ESD bus coupled with said plurality of first ESD bi-directional connection devices;

a second ESD bus coupled with said plurality of second ESD bi-directional connection devices and said plurality of third ESD bi-directional connection devices;

a third ESD bus coupled with said plurality of fourth ESD bi-directional connection devices; and a plurality of ESD clamp device, wherein said first ESD bus, said second ESD bus and said third ESD bus being coupled together through said plurality of ESD clamp device for discharging a current caused by said plurality of internal circuits through said plurality of first ESD bi-directional connection device to said first ESD bus, through said plurality of second ESD bi-directional connection devices and said plurality of third ESD bi-directional connection devices to said second ESD bus.

11. The apparatus according to claim 10, wherein said first ESD bi-directional connection device, comprises:

a first PSCR (p-type silicon controlled rectifier) device, wherein a gate of said first PSCR device coupled with an cathode of said first PSCR device and an anode of said first PSCR device coupled with said first electrostatic-discharge bus; and a second PSCR device, wherein an anode of said second PSCR device coupled with said cathode of said first PSCR device and to said first power line, a cathode of said second PSCR device coupled with a gate of said second PSCR device.

12. The apparatus according to claim 10, wherein said second ESD bi-directional connection devices, comprises:

a first PSCR (p-type silicon controlled rectifier) device, wherein a gate of said first PSCR device coupled with an cathode of said first PSCR device and an anode of said first PSCR device coupled with said second electrostatic-discharge bus; and a second PSCR device, wherein an anode of said second PSCR device coupled with said cathode of said first PSCR device and to said second power line, a cathode of said second PSCR device coupled with a gate of said second PSCR device.

13. The apparatus according to claim 10, wherein said third ESD bi-directional connection devices, comprises:

a first PSCR (p-type silicon controlled rectifier) device, wherein a gate of said first PSCR device coupled with an cathode of said first PSCR device and an anode of said first PSCR device coupled with said second electrostatic-discharge bus; and a second PSCR device, wherein an anode of said second PSCR device coupled with said cathode of said first PSCR device and to said third power line, a cathode of said second PSCR device coupled with a gate of said second PSCR device.

14. The apparatus according to claim 10, wherein said fourth ESD bi-directional connection devices, comprises:

a first PSCR (p-type silicon controlled rectifier) device, wherein a gate of said first PSCR device coupled with an cathode of said first PSCR device and an anode of said first PSCR device coupled with said third electrostatic-discharge bus; and a second PSCR device, wherein an anode of said second PSCR device coupled with said cathode of said first PSCR device and to said fourth power line, a cathode of said second PSCR device coupled with a gate of said second PSCR device.

15. The apparatus according to claim 10, wherein said first ESD bi-directional connection devices, comprises:
a first NSCR (n-type silicon controlled rectifier) device, wherein a gate of said first NSCR device coupled with an anode of said first NSCR device and a cathode of said first NSCR device coupled with said first electrostatic-discharge bus; and
a second NSCR device, wherein a cathode of said second NSCR device coupled with said anode of said first NSCR device and to said first power line, and an anode of said second NSCR device coupled with a gate of said second NSCR device.

16. The apparatus according to claim 10, wherein said second ESD bi-directional connection devices, comprises:
a first NSCR (n-type silicon controlled rectifier) device, wherein a gate of said first NSCR device coupled with an anode of said first NSCR device and a cathode of said first NSCR device coupled with said second electrostatic-discharge bus; and
a second NSCR device, wherein a cathode of said second NSCR device coupled with said anode of said first NSCR device and to said second power line, and said anode of said second NSCR device coupled with a gate of said second NSCR device.

17. The apparatus according to claim 10, wherein said third ESD bi-directional connection devices, comprises:
a first NSCR (n-type silicon controlled rectifier) device, wherein a gate of said first NSCR device coupled with an anode of said first NSCR device and a cathode of said first NSCR device coupled with said second electrostatic-discharge bus; and
a second NSCR device, wherein a cathode of said second NSCR device coupled with said anode of said first NSCR device and to said third power line, and said anode of said second NSCR device coupled with a gate of said second NSCR device.

18. The apparatus according to claim 10, wherein said fourth ESD bi-directional connection devices, comprises:
a first NSCR (n-type silicon controlled rectifier) device, wherein a gate of said first NSCR device coupled with an anode of said first NSCR device and a cathode of said first NSCR device coupled with said third electrostatic-discharge bus; and
a second NSCR device, wherein a cathode of said second NSCR device coupled with said anode of said first NSCR device and to said fourth power line, and said anode of said second NSCR device coupled with a gate of said second NSCR device.

19. The apparatus according to claim 10, wherein said ESD clamp device, comprises:
a plurality of NCLSCR (NMOS-controlled lateral silicon controlled rectifier) devices coupled together in a series, wherein said plurality of NCLSCR devices coupled with between said first ESD bus and said second ESD bus, between said second ESD bus and said third ESD bus, or between said third ESD bus and said first ESD bus, and a gate of each of said plurality of NCLSCR devices coupled with a node; and
an ESD-detection circuit coupled between said first ESD bus and said second ESD bus, between said second ESD bus and said third ESD bus, or between said third ESD bus and said first ESD bus, wherein said node coupled with said ESD-detection circuit.

20. The apparatus according to claim 10, wherein said ESD clamp devices, comprises:
a plurality of PCLSCR (PMOS-controlled lateral silicon controlled rectifier) devices coupled together in a series, wherein said plurality of ICLSCR devices coupled between said first ESD bus and said second ESD bus, between said second ESD bus and said third ESD bus, or between said third ESD bus and said first ESD bus, and a gate of each of said plurality of PCLSCR devices coupled with a node;
an ESD-detection circuit coupled between said first ESD bus and said second ESD bus, between said second ESD bus and said third ESD bus, or between said third ESD bus and said first ESD bus; and
an inverter having an input terminal and an output terminal, wherein said input terminal coupled with said ESD-detection circuit and said output terminal coupled with said node.

21. The apparatus according to claim 10, wherein said ESD clamp devices, comprising:
a plurality of NCLSCR (NMOS-controlled lateral silicon controlled rectifier) devices coupled together in a series, and each of said plurality of NCLSCR devices coupled with a diode in a series, wherein said plurality of NCLSCR devices coupled between said first ESD bus and said second ESD bus, between said second ESD bus and said third ESD bus, or between said third ESD bus and said first ESD bus, and a gate of each of said plurality of NCLSCR devices coupled with a node; and
an ESD-detection circuit coupled between said first ESD bus and said second ESD bus, between said second ESD bus and said third ESD bus, or between said third ESD bus and said first ESD bus, wherein said node coupled with said ESD-detection circuit.

22. The apparatus according to claim 10, wherein said ESD clamp devices, comprises:
a plurality of PCLSCR (PMOS-controlled lateral silicon controlled rectifier) devices coupled together in a series and each of said plurality of PCLSCR devices coupled with a diode in a series, wherein said plurality of PCLSCR devices coupled between said first ESD bus and said second ESD bus, between said second ESD bus and said third ESD bus, or between said third ESD bus and said first ESD bus, and a gate of each of said plurality of PCLSCR devices coupled with a node;
an ESD-detection circuit coupled between said first ESD bus and said second ESD bus, between said second ESD bus and said third ESD bus, or between said third ESD bus and said first ESD bus; and
an inverter having an input terminal and an output terminal, wherein said input terminal coupled with said ESD-detection circuit and said output terminal coupled with said node.

23. The apparatus according to claim 10, wherein said first power line is coupled with a 2.5-Volt power supply and said second power line is coupled with a 0-Volt power supply.

24. The apparatus according to claim 10, wherein said third power line is charged about a 5-Volt and said fourth power line is charged a 0-Volt.

25. A method for electrostatic discharging of an integrated circuit, comprises:
conducting an electrostatic-discharge (ESD) current from an internal circuit of said integrated circuit into a power line of said internal circuit;
conducting said ESD current into an ESD bi-directional connection device;

conducting said ESD current into a first ESD bus of said integrated circuit;

conducting said ESD current into an ESD clamp device to discharge said ESD current; and conducting said ESD current into an second ESD bus of said integrated circuit to unify voltage level of said first ESD bus and said second ESD bus.

26. The method according to claim 25, wherein said first ESD bus is a metal line that is surrounded around said integrated circuit.

27. The method according to claim 25, wherein said second ESD bus is a metal line that is surrounded around said integrated circuit.

28. The method according to claim 25, wherein each of said ESD bi-directional connection device, comprises:

a first PSCR (p-type silicon controlled rectifier) device, wherein a gate of said first PSCR device coupled with an cathode of said first PSCR device and an anode of said first PSCR device coupled with said first electrostatic-discharge bus; and a second PSCR device, wherein an anode of said second PSCR device coupled with said cathode of said first PSCR device and to said power line, a cathode of said second PSCR device coupled with a gate of said second PSCR device.

29. The method according to claim 25, wherein each of said ESD bi-directional connection devices, comprises:

a first NSCR (n-type silicon controlled rectifier) device, wherein a gate of said first NSCR device coupled with an anode of said first NSCR device and a cathode of said first NSCR device coupled with said first electrostatic-discharge bus; and a second NSCR device, wherein a cathode of said second NSCR device coupled with said anode of said first NSCR device and to said power line, and an anode of said second NSCR device coupled with a gate of said second NSCR device.

30. The method according to claim 25, wherein each of said ESD clamp devices, comprises:

a plurality of NCLSCR (NMOS-controlled lateral silicon controlled rectifier) devices coupled together in a series, wherein said plurality of NCLSCR devices forward coupled with between said first ESD bus and said second ESD bus, and a gate of each of said plurality of NCLSCR devices coupled with a node; and an ESD-detection circuit coupled with said first ESD bus and said second ESD bus, wherein said node coupled with said ESD-detection circuit.

31. The method according to claim 25, wherein each of said ESD clamp devices, comprises:

a plurality of PCLSCR (PMOS-controlled lateral silicon controlled rectifier) devices coupled together in a series, wherein said plurality of PCLSCR devices coupled with said first ESD bus and said second ESD bus, and a gate of each of said plurality of PCLSCR devices coupled with a node;

an ESD-detection circuit coupled with said first ESD bus and said second ESD bus; and an inverter having an input terminal and an output terminal, wherein said input terminal coupled with said ESD-detection circuit and said output terminal coupled with said node.

32. The method according to claim 25, wherein each of said ESD clamp devices, comprises:

a plurality of NCLSCR (NMOS-controlled lateral silicon controlled rectifier) devices coupled together in a series, and each of said plurality of NCLSCR devices coupled with a diode in a series, wherein said plurality of NCLSCR devices forward coupled between said first ESD bus and said second ESD bus and a gate of each of said plurality of NCLSCR devices coupled with a node; and an ESD-detection circuit coupled between said first ESD bus and said second ESD bus, wherein said node coupled with said ESD-detection circuit.

33. The method according to claim 25, wherein each of said ESD clamp devices, comprises:

a plurality of PCLSCR (PMOS-controlled lateral silicon controlled rectifier) devices coupled together in a series and each of said plurality of PCLSCR devices coupled with a diode in a series, wherein said plurality of PCLSCR devices forward coupled with said first ESD bus and said second ESD bus, and a gate of each of said plurality of PCLSCR devices coupled with a node;

an ESD-detection circuit coupled with said first ESD bus and said second ESD bus; and an inverter having an input terminal and an output terminal, wherein said input terminal coupled with said ESD-detection circuit and said output terminal coupled with said node.

34. The method according to claim 25 wherein said ESD bi-directional connection device, comprises:

a plurality of NSCR (N-type silicon controlled rectifier) devices coupled together in a series, wherein a gate of each of said plurality of NSCR devices coupled with an anode of each of said plurality of NSCR device; and a diode coupled with said plurality of NSCR devices in parallel, wherein a cathode of said diode coupled with said anode of said plurality of NSCR devices and said first ESD bus, and an anode of said diode coupled with said cathode of said plurality of NSCR device, and coupled with said power line of said internal circuits.

35. The method according to claim 34, further comprises a diode coupled with each of said plurality of NSCR devices in a series.

36. The method according to claim 25, wherein said ESD bi-directional connection device, comprises:

a plurality of PSCR (P-type silicon controlled rectifier) devices coupled together in a series, wherein a gate of each of said plurality of PSCR devices coupled with a cathode of each of said plurality of PSCR device; and a diode coupled with said plurality of PSCR devices in parallel, wherein a cathode of said diode coupled with said anode of said plurality of PSCR devices and said first ESD bus, and an anode of said diode coupled with said cathode of said plurality of PSCR device and said power line of said internal circuits.

37. The method according to claim 36, further comprises a diode coupled with each of said plurality of PSCR devices in a series.

* * * * *